United States Patent [19]

Endroes et al.

[11] Patent Number: 5,650,363
[45] Date of Patent: Jul. 22, 1997

[54] METHOD FOR PROCESSING THIN WAFERS AND SOLAR CELLS OF CRYSTALLINE SILICON

[75] Inventors: Arthur Endroes, Munich; Karl-Heinz Eisenrith, Schliersee; Giuliano Martinelli, Ferrara, all of Germany

[73] Assignee: Siemens Aktiengesellschaft, Munich, Germany

[21] Appl. No.: 432,098

[22] Filed: May 1, 1995

[30] Foreign Application Priority Data

Apr. 29, 1994 [DE] Germany ............ 44 15 132.2

[51] Int. Cl.⁶ .................................................. H01L 21/461
[52] U.S. Cl. .................... 437/249; 437/226; 437/227
[58] Field of Search .................. 437/226, 227, 437/249; 216/52

[56] References Cited

U.S. PATENT DOCUMENTS

| | | |
|---|---|---|
| 4,717,790 | 1/1988 | Gochermann. |
| 4,735,909 | 4/1988 | Albright et al. ............ 437/249 |
| 5,158,645 | 10/1992 | Covert et al. ............ 216/52 |
| 5,393,711 | 2/1995 | Biallas et al. ............ 437/226 |
| 5,400,548 | 3/1995 | Huber et al. ............ 437/249 |
| 5,494,549 | 2/1996 | Oki et al. ............ 437/226 |

OTHER PUBLICATIONS

"Crystalline Silicon for Solar Cells," Martinelli, Solid State Phenomena, vol. 32–33 (1993) pp. 21–26.

"Growth of Stable Dislocation–Free 3–Grain Silicon Ingots for Thinner Slicing," Martinelli et al., Appl. Phys. Lett. vol. 62, No. 25, Jun. 21, 1993, pp. 3262–3263.

*Primary Examiner*—Kevin Picardat
*Attorney, Agent, or Firm*—Hill, Steadman & Simpson

[57] ABSTRACT

Thin semiconductor wafers and components manufactured therefrom, for instance solar cells of crystalline silicon, are subject to an increased breakage risk because of the brittle nature of the material and require a minimum thickness for the wafer in order to assure reliable handling. For improving the handling, a semiconductor wafer is provided surface-wide with a mechanical protective layer and this semiconductor wafer is subsequently subjected to a shaping treatment.

8 Claims, 2 Drawing Sheets

1

METHOD FOR PROCESSING THIN WAFERS AND SOLAR CELLS OF CRYSTALLINE SILICON

BACKGROUND OF THE INVENTION

1. Field of the Invention

The present invention is directed to a method for processing thin wafers and solar cells of the type composed of crystalline silicon.

2. Description of the Prior Art

Solar cells of crystalline silicon (C—Si) are widespread for terrestrial use. The demands made of solar cells for environmental compatibility, large-area produceability, high efficiency and reasonable cost have been well satisfied by these solar cells. Compared to thin-film solar cells of amorphous silicon (A—Si:H), copper-indium (gallium)diselenide (CIS, CGS) and cadmium telluride (CdTe), however, they also have a few disadvantages.

Crystalline silicon is extremely brittle and, consequently, is easily broken. Manipulatable wafers of C—Si or solar cells manufactured of this material must currently have a thickness of approximately 300 μm in order to be able to assure a reliable processing and manipulatibility due to the significant risk of breakage. Due to the fragility, the shaping of the wafer had to hitherto be undertaken by a suitable edging of the C—Si single-crystal rod, i.e. even before the sawing of the wafer. Individualized shaping for a single wafer or for a single solar cell is therefore not possible or is only possible with great outlay.

Heretofore, it was not possible to apply solar cells produced of crystalline silicon on highly curved surfaces without this leading to a breakage of the solar cells. Although European Application 0 221 287 discloses a method with which solar cells of crystalline silicon can be embedded between a slightly curved carrier and a uniformly arced glass pane using specific laminating technique. This method, however, is limited to surfaces having no more than a slight arc such as, for example, the roof of a motor vehicle.

SUMMARY OF THE INVENTION

It is an object of the present invention to specify a method for shaping wafers of crystalline semiconductor material which avoids the above-recited disadvantages and makes it possible in a simple way to apply semiconductor wafers and, in particular, solar cells on curved surfaces or to lend them a desired shape.

The above object is achieved in accordance with the principles of the present invention in a method for shaping processing of a thin semiconductor wafer wherein the semiconductor wafer is provided surface-wide with a mechanical protective layer before processing the semiconductor wafer, with the protective layer thereon, to give the semiconductor wafer a selected shape.

It has been found that a thin semiconductor wafer is protected against microscopic damage by a mechanical protective layer that is applied surface-wide. Crack formation and the breakage of the semiconductor wafer are prevented in this way. A prerequisite for this is that the protective layer lies tightly on the wafer, adhered thereto with adequate adhesion, and is adequately flexible. Such a protective layer allows the thickness of the semiconductor wafer to be noticeably reduced without increasing the breakage risk thereof at the same time.

With a reduced thickness of, for example, 170 μm or less, moveover, a semiconductor wafer inventively provided with a protective layer exhibits new, unexpected, advantageous properties. Such a semiconductor wafer can be bent without risk and without a fracture thereof immediately occurring. Radii of curvature of 20 cm and less are thereby achieved dependent on the thickness of the semiconductor wafer. As a result, it is possible for the first time to apply semiconductor wafers or components such as solar cells manufactured therefrom onto significantly curved surfaces. The use possibilities of such components are thereby substantially expanded. For example, solar cells can now be directly applied onto one-dimensionally highly curved surfaces, for example, onto articles of use, vehicles or exteriors of buildings in a simple way, this having hitherto not been possible.

A further advantage arises as a result of the reduced thickness of the semiconductor wafer. Semiconductor material is saved in the manufacture of the flat component and additional physical advantages for the component are obtained. In a thinner solar cell, for example, the path length that the photovoltaically generated charge carrier pairs must traverse in the inside of the semiconductor until they reach the current-collecting contacts at the front side and back side is shortened. As a result of the shorter path length, the recombination probability is diminished, so that more charge carriers can be collected and the solar cell achieves a higher efficiency.

The mechanical protective layer utilized in the inventive method can be manufactured of an arbitrary material that satisfies the aforementioned demands. A protective layer offers special advantages, however, when it can remain on the semiconductor wafer or the component manufactured therefrom as a functional layer or when it can be in turn removed in a simple way.

A protective layer that is simple to apply and simple to remove in turn is composed, for example, of a plastic that can be applied in liquid form and that can be subsequently hardened. It is possible, for example, to dissolve an organic polymer in a suitable solvent, to apply this on the semiconductor wafer, to dry it and, if necessary, to cure it.

Dependent on the type of polymer, the curing can ensue thermally, or by the action of electromagnetic radiation or by a combination of the two. An appropriate low-viscosity polymer or the shorter-chained precursor compound (precursor or monomer) thereof can be applied free of solvent and can be converted into a solid by the curing. For example, the polymer can be a radiation-curable coating compound or can be a photoresist. It is also possible, however, to apply single-component or two-component reaction resins. For example, epoxy resins can be fashioned as systems that cure merely by radiation by employing suitable photoinitiators. A reaction resin mixture composed of a resin component and a hardener component is mixed immediately before application onto the semiconductor wafer and can then already be cured at moderate temperatures.

A mechanical protective layer that simultaneously constitutes a functional layer of the component to be manufactured from the semiconductor wafer can, for example, be an electrically conductive layer. The protective layer to be inventively applied can therefore be a metal layer. Required for this purpose, however, is that the metal layer be composed of an adequately flexible metal.

A further suitable protective layer can be composed of a conductive paste that is printed on the wafer and driven in by pressure. In addition to a high proportion of metallic particles, this paste also has a sinterable ceramic component and, possibly, an organic binder for setting the properties of use. Suitable known conductive pastes, for example, contain silver, tin or alloys thereof in addition to glass particles.

The conductive pastes can be printed surface-wide on the semiconductor wafer in a simple way and, after being driven in, constitute a protective layer for the semiconductor wafer that has good adhesion and is mechanically stable. They can serve as a current-carrying contact for the component to be manufactured therefrom.

It is adequate for the inventive method to apply the protective layer in a thickness in the range of 10–20 µm. Since the thickness of the protective layer-in addition to the thickness of the semiconductor wafer-is critically defined by the material properties of the protective layer, protective layer thicknesses that proceed beyond this range can be possible or required. It has been shown that the inventive method, even given the employment of a protective layer fabricated of a soft polymer, leads to improved workability and to a higher flexibility of the semiconductor wafer.

The inventive method is especially advantageously utilized for processing semiconductor wafers that are thin silicon tri-crystal wafers. Such a tri-crystal is known from an article by G. Martinelli in Solid State Phenomena, Vol. 32–33 (1993), pp. 21–26. This tri-crystal is composed of three monocrystalline regions tilted relative to one another. The phase boundaries between two monocrystalline regions are formed by planes. Three such planes exist, intersecting along a straight line. None of these planes, however, intersects the entire tri-crystal. The boundary surfaces between two of the monocrystalline regions are preferably formed by crystallographically defined planes of the silicon crystal and are <111>-planes. Consequently, the planes defined by these boundary surfaces also intersect at crystallographically determined angles that assume values from 109.47° and 125.26° in the ideal case.

Such a tri-crystal has the advantage that it contains no <111>-planes that proceed obliquely through the crystal. By contrast, a conventional silicon monocrystal has a number of such planes. Shifts (offsets, misalignments) can arise parallel to these planes during the crystal drawing, these constituting the most likely fracture points in the wafer which is subsequently sawn from the crystal. In a tri-crystal, by contrast, there is no such offset or misalignment plane that cuts through the entire crystal.

Thin wafers can be sawn from such a tri-crystal, these being extraordinarily resistant to breakage for their low thickness. For example, wafers having a thickness of only 60 µm can be sawn from the tri-crystal with a high yield of, for example, 95%.

A thin wafer sawn from a silicon tri-crystal is stabilized with the inventive method such that it achieves unusual properties that were hitherto unknown. When a silicon tri-crystal wafer having a thickness of 30–150 µm, is provided with an organic protective layer that is 10–20 µm thick, it can be manipulated almost like a sheet of paper without breaking. An inventively coated silicon tri-crystal is unusually flexible and achieves radii of curvature down to 2 cm or less without breaking.

Such a coated silicon tri-crystal wafer can be formed into an arbitrary external shape in the inventive method. The wafer or the component manufactured therefrom can be given such an arbitrary exterior shape on the basis of simple punching or cutting with a blade without damaging the component. The polymer layer can be in turn subsequently removed with a solvent. The coated silicon tri-crystal wafer is thereby so stable that even the punching of a "hole" having an arbitrary contour from the middle of the wafer becomes possible. Such a wafer can be given into practically any conceivable exterior shape with the inventive method and fashioned, for example, as a solar cell can be applied onto arbitrarily shaped bases or surfaces. Such surfaces can even have elevations for which an appropriately shaped recess is provided or produced in the solar cell.

DESCRIPTION OF THE PREFERRED EMBODIMENTS

Figure 1:
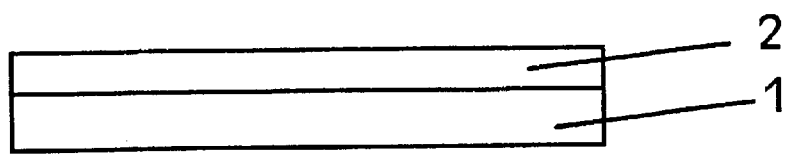
FIGS. 1–4 show a semiconductor wafer provided with a protective layer in a sequence of processing steps in accordance with the principles of the present invention.

Application of a protective layer on a semiconductor wafer is illustrated in FIG. 1. A protective layer 2 which may be composed of an organic polymer is first applied on a semiconductor wafer 1 of crystalline silicon having a thickness of less than 170 µm. In this embodiment, a UV-curable, negatively functioning photoresist is employed. The photoresist is sprayed on, brushed on or spun on in the standard way of semiconductor manufacture as a solution. After the surface-wide application of the protective layer 2, this layer is dried. The protective layer 2 can be heated and/or incipiently cured for acceleration. A ten-second heating to 150° is adequate for this purpose.

For curing, the protective layer 2 is irradiated with an ultraviolet radiation source and, for example, is exposed to a radiation of 380 nm for one second. The cured protective layer 2 exhibits good adhesion on the semiconductor wafer 1 and has a thickness of 10–20 µm.

In another embodiment, the protective layer 2 can be formed by a paste containing silver and silicon dioxide particles applied surface-wide on the surface of the semiconductor wafer 1 using a silkscreening process. A conventional silkscreening paste can be employed for this purpose, of the type employed in a standard fashion in photovoltaics for producing back contacts. After the surface-wide application of the paste, the organic binder contained therein is burned off, whereby the paste layer is sintered firmly on the semiconductor body by virtue of the $SiO_2$ particles contained therein. A uniform, metallically conductive protective layer 2 having a thickness of about 10–20 µm is obtained.

Figure 2:
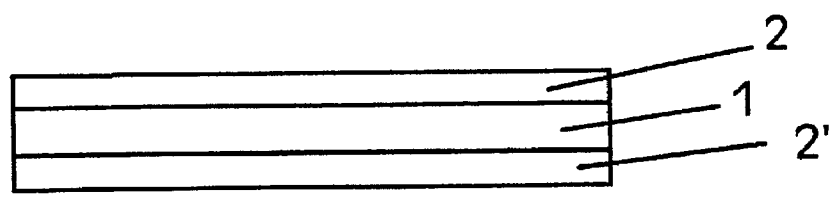

In a further embodiment of the invention, FIG. 2 shows a semiconductor wafer 1 that is provided with a protective layer 2 on both surfaces. It is thereby possible to employ the same or different material for both protective layers 2 or 2'. It is possible, for example, to first manufacture one of the protective layers 2 of a metallically conductive layer and to subsequently manufacture the second protective layer 2', of an organic polymer to be applied later.

A semiconductor wafer 1 provided with at least one protective layer 2 can now be manipulated almost like a sheet of paper and can now be subjected to a shaping process. Such a shaping process can include one-dimensionally bending the semiconductor wafer, in order, for example, to glue or laminate the wafer on a curved surface or to secure it thereto in some other way. It is also possible to bring the semiconductor wafer 1 provided with the protective layers 2 into a desired, exterior shape by punching, sawing or cutting or to provide it with a desired customizing.

Figure 3:
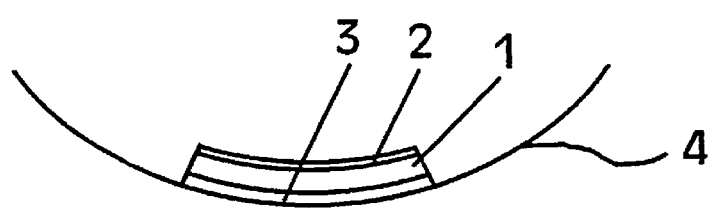

FIG. 3 shows a semiconductor wafer 1 provided with a protective layer 2 that has been applied on an arced carrier 4. The semiconductor wafer 1, for example, is a solar cell whose protective layer 2, for example, is a metallically conductive back contact applied by silkscreening an subsequent pressurization. For example, a curved glass pane can serve as the carrier 4. The gluing can ensue by means of a glue layer 3. In the simplest case, the glue layer 3 is a thermoplastic hot-melt adhesive foil that is arranged between the solar cell 1 and the carrier 4 composed of glass. While exerting a slight external pressure, the entire arrangement is now brought to a point beyond the softening point of the hot-melt adhesive foil and is subsequently cooled. The laminate shown in FIG. 3 is thereby produced.

It is also possible to apply an organic polymer layer composed, for example, of photoresist as protective layer and to cure it. After the shaping processing, for example the gluing onto an arced carrier, the protective layer can in turn be removed with a solvent, for example with acetone.

Figure 4:
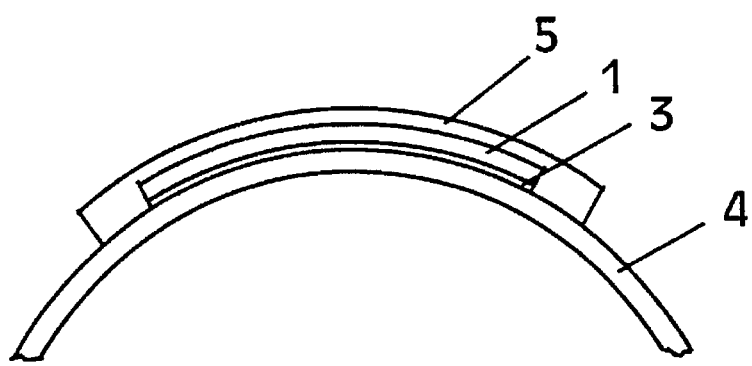

FIG. 4 shows a further possibility of shaping processing. A solar cell 1 provided with a protective layer 2 is glued with a glue layer 3 onto an outwardly arced carrier 4 composed, for example, of glass. The protective layer 2 (not shown in FIG. 4) is removed after the gluing of the solar cell 1. A further layer 5 is now laminated on for covering the solar cell 1; this can be a further thermoplastic hot-melt adhesive foil or a protective foil applied with such a hot-melt adhesive foil. The laminate is completed by a cover 5 and the solar cell 1 is completely covered. The cover 5 has an overlap at all sides of the solar cell 1 which enters into a firm connection with the base or with the carrier 4 during the laminating process.

Figure 5:
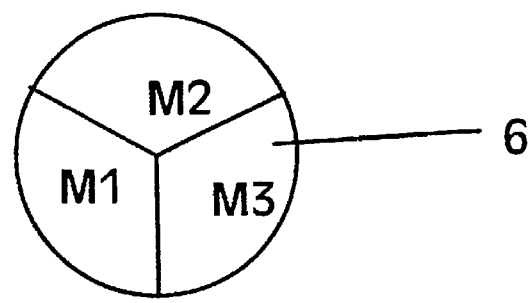
FIGS. 5 shows a silicon tri-crystal wafer, suitable for use in the inventive method, in a plan view.

FIG. 5 shows a tri-crystal wafer 6 sawn from a tri-crystal block in a plan view. The three monocrystalline regions M1, M2 and M3 tilted relative to one another meet in the middle, so that none of the boundary surfaces can form a plane that cuts completely through the tri-crystal. Two of the planes between the monocrystalline regions are preferably <111>-planes of the silicon or are planes that deviate by a maximum of ±2% from this crystallographically defined plane. No crystallographic planes form at the third boundary surface because of the larger angle available. This is referred to as a boundary surface of the second order.

A semiconductor wafer 1 composed of such a silicon tri-crystal wafer 6 can be sawn from a larger tri-crystal block so that the wafer has a thickness from about 30 µm and, as described with respect to FIGS. 1 and 2, can be provided with a protective layer 2 at one side or at both sides. In this case, as well the thickness of the protective layer amounts to 10–20 µm. The semiconductor wafer 1 (tri-crystal wafer) provided with the protective layer 2 exhibits unusual flexibility and is resistant to breakage in shaping processings. This composite can thereby be curved to an extreme degree without breaking, whereby curvature radii of 2 cm or less can be achieved. Accordingly, the composite can be secured by gluing or laminating to a correspondingly highly curved foundation (see FIGS. 3 and 4).

Figure 6:
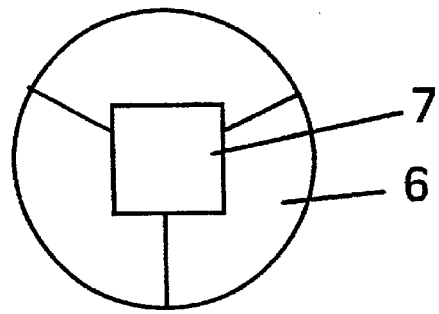
FIG. 6 shows a semiconductor wafer with a recess, produced according to the inventive method, in a plan view.

It is also possible to give the semiconductor wafer 1 provided with the protective layer 2 a selected cut by punching or cutting. As shown in FIG. 6, an arbitrarily shaped recess 7 can be removed from the semiconductor wafer 1 without the wafer losing mechanical stability. The semiconductor wafer 1 provided with the recess 7 (and with the protective layer 2) can also be subjected to a further, shaping processing and, for example, can again be glued or laminated onto one-dimensionally curved surfaces.

The inventive method is especially advantageously employed in the manufacture of solar cells, whereby such cells fabricated from a tri-crystal wafer can be selectively cut so as to be matched to the surface on which the solar cell is to be secured. Further, the inventive method can be used to apply the solar cells to curved, and in particular to highly curved, surfaces, this having hitherto not been possible with solar cells of crystalline silicon.

In general as well, however, the inventive method serves the purpose of reducing the breakage risk of the semiconductor wafers in various processing steps in the manufacture of solar cells. In addition to the enhanced process reliability in the manipulation of the semiconductor wafers and in the manufacture solar cells therefrom, it is thereby possible to implement the solar cells thinner than previously, resulting in the further, initially cited advantages for the solar cell properties.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for processing a thin semiconductor wafer comprising the steps of:

providing a crystalline silicon semiconductor wafer having a thickness in a range from 30–170 µm;

covering said semiconductor wafer surface-wide with a mechanical protective layer; and processing said semiconductor wafer with said mechanical protective layer thereon to give said semiconductor wafer a selected shape by subjecting said semiconductor wafer with said mechanical protective layer thereon to a shaping process selected from the group consisting of cutting, sawing and punching.

2. A method as claimed in claim 1 comprising the additional step of removing said mechanical protective layer from said semiconductor wafer after giving said semiconductor wafer said selected shape.

3. A method as claimed in claim 1 wherein said semiconductor wafer has opposed, principal surfaces, and wherein the step of covering said semiconductor wafer surface-wide with a mechanical protective layer comprises applying a mechanical protective layer to each of said opposed, principal surfaces of said semiconductor wafer.

4. A method as claimed in claim 1 comprising the additional step of providing a silicon tri-crystal wafer as said semiconductor wafer.

5. A method as claimed in claim 1 comprising the additional step of providing a component manufactured from a silicon tri-crystal wafer as said semiconductor wafer.

6. A method as claimed in claim 1 wherein the step of covering said semiconductor wafer surface-wide with a mechanical protective layer comprises applying a protective layer consisting of an organic polymer in a thickness of approximately 10–50 µm onto said semiconductor wafer.

7. A method as claimed in claim 1 wherein the step of providing said semiconductor wafer surface-wide with a mechanical protective layer comprises applying a metallic, electrically conductive printable paste onto said semiconductor wafer as said mechanical protective layer.

8. A method as claimed in claim 1 comprising the additional step of forming a solar cell from said semiconductor wafer with said selected shape.

* * * * *